(12) United States Patent
Bierhuizen et al.

(10) Patent No.: US 7,663,152 B2
(45) Date of Patent: Feb. 16, 2010

(54) ILLUMINATION DEVICE INCLUDING WAVELENGTH CONVERTING ELEMENT SIDE HOLDING HEAT SINK

(75) Inventors: Serge J. Bierhuizen, Milpitas, CA (US); Edwin de Groot, Saratoga, CA (US); Gerard Harbers, Sunnyvale, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 52 days.

(21) Appl. No.: 11/463,443

(22) Filed: Aug. 9, 2006

(65) Prior Publication Data
US 2008/0123339 A1     May 29, 2008

(51) Int. Cl.
F21V 9/00 (2006.01)

(52) U.S. Cl. .................. 257/98; 257/99; 257/E33.073; 362/231

(58) Field of Classification Search .................. 257/98, 257/99, 79, 231, E33.073; 362/231
See application file for complete search history.

(56) References Cited

U.S. PATENT DOCUMENTS

| | | | |
|---|---|---|---|
| 6,734,465 B1 * | 5/2004 | Taskar et al. | 257/80 |
| 2004/0070338 A1 * | 4/2004 | Noguchi et al. | 313/512 |
| 2005/0006659 A1 * | 1/2005 | Ng et al. | 257/99 |
| 2006/0124953 A1 * | 6/2006 | Negley et al. | 257/99 |
| 2006/0186378 A1 * | 8/2006 | Putnam | 252/301.4 R |
| 2006/0239006 A1 * | 10/2006 | Chaves et al. | 362/294 |

* cited by examiner

Primary Examiner—Sue Purvis
Assistant Examiner—Selim Ahmed
(74) Attorney, Agent, or Firm—Patent Law Group

(57) ABSTRACT

An illumination device includes a light source, such as one or more light emitting diodes in an array, that produces light having a first wavelength range. A separated wavelength converting element is mounted to receive the light emitted by the light source. The wavelength converting element is physically separated from the light source along the beam path. The wavelength converting element converts the light having a first wavelength range into light having a second wavelength range. In one embodiment, a color separation element is directly coupled to the wavelength converting element. The color separation element is also physically separated from the light source. In another embodiment, the wavelength converting element is held by a heat sink by the sides.

29 Claims, 7 Drawing Sheets

ILLUMINATION DEVICE INCLUDING WAVELENGTH CONVERTING ELEMENT SIDE HOLDING HEAT SINK

FIELD OF THE INVENTION

The present invention is related to an illumination device and, in particular, to wavelength conversion of light produced by high radiance light sources, including semiconductor light emitting devices.

BACKGROUND

Lighting devices that use light emitting diodes (LEDs) are becoming increasingly common in many lighting applications. Generally, LEDs use phosphor conversion of the primary emission to generate white light, but phosphors can also be used to create more saturated colors like red, green and yellow.

Conventional devices that place the phosphor in physical contact with the LEDs suffer from disadvantages such as a limited bonding temperature range. Moreover, the bonding material choice can impact cost as well as reliability, e.g., caused by thermally induced mechanical stress. Accordingly, improvements are desirable.

SUMMARY

In accordance with one aspect of the present invention, an illumination device includes a color separation element that is directly coupled to the wavelength converting element, both of which are separated from the light source along the light path. The light source may be, e.g., one or more light emitting diodes in an array that produce light having a first wavelength range. The wavelength converting element is mounted to receive the light emitted by the light source and is physically separated from the light source. The wavelength converting element partially or fully converts the light having a first wavelength range into light having a second wavelength range. In another aspect of the present invention, the wavelength converting element is held by a heat sink by at least one side so that neither the primary light nor the secondary light is transmitted through the heat sink.

DETAILED DESCRIPTION

In accordance with an embodiment of the present invention, the wavelength converting element is physically separated from the light source and is directly coated with a color separation coating. In this embodiment, there is no need for a separate color separation element, and therefore significantly improves the extraction efficiency by recycling the backwards emitted wavelength converted light and it also increases external polarization and aperture recycling since there are no losses from an extra element. In another embodiment, an efficient edge cooling system is used to hold the wavelength converting element.

Figure 1:
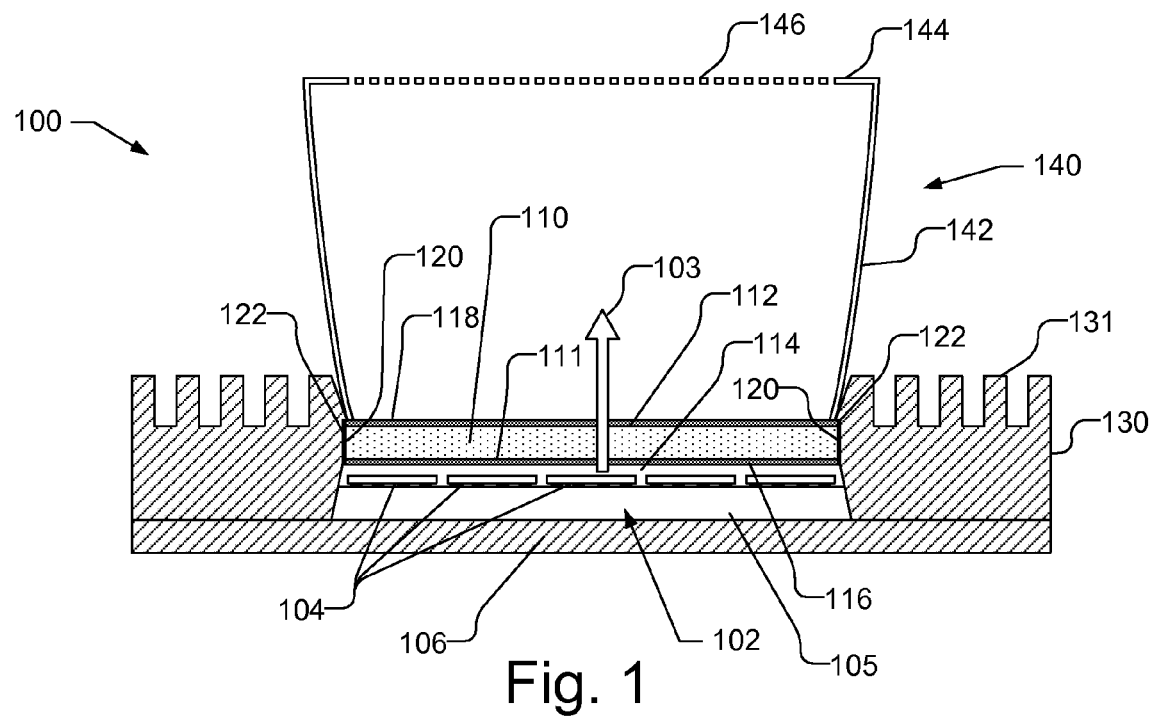
FIG. 1 illustrates an illumination device in accordance with one embodiment of the present invention.

FIG. 1 illustrates an illumination device 100 in accordance with one embodiment of the present invention. FIG. 1 includes a light source 102, which may be, e.g., a semiconductor light emitting device, such as a light emitting diode (LED) or an array of LEDs 104, or other types of light sources that can produce short wavelength light, such as a Xenon lamp or Mercury lamp. By way of example, the LEDs 104 are blue or ultraviolet (UV) LEDs and may be high radiance devices, such as the type described in U.S. Ser. No. 10/652,348, entitled "Package for a Semiconductor Light Emitting Device", by Frank Wall et al., filed Aug. 29, 2003, Pub. No. 2005/0045901, having the same assignee as the present disclosure and which is incorporated herein by reference. The angular emission pattern of the LEDs 104 can be lambertian or controlled using a photonic crystals such as lattice structures. The light emitting diodes 104 are shown as being mounted on a heatsink 106. In some embodiments, the light emitting diodes 104 may be mounted on a submount 105, which is mounted to the heatsink 106.

Illumination device 100 includes a wavelength converting element 110 that is physically separated from the light source 102 along the optical path (generally illustrated by arrow 103), i.e., the input side 111 of the wavelength converting element 110 is not in direct contact with the light source 102. The light source 102 and the wavelength converting element 110 may be separated by a medium 114, such as air, gas, silicone or a vacuum. Thus, light emitted by the light source 102 must travel through the medium 114 before the light is received at the input side 111 of the wavelength converting element 110. The length of the physical separation between the light source 102 and the wavelength converting element 110 may vary, but in one embodiment is in the range of 50 µm-250 µm. In one embodiment, the physical separation between the light source 102 and the wavelength converting element 110 is sufficient to prevent substantial conductive heating of the wavelength converting element 110 by the light source 102. In another embodiment, a filler or bonding material may be used to separate the light source 102 from the wavelength converting element 110.

The wavelength converting element 110 may be formed from a ceramic slab, sometimes referred to herein as a "luminescent ceramic". The ceramic slabs are generally self-supporting layers and may be translucent or transparent to particular wavelengths, which may reduce the scattering loss associated with non-transparent wavelength converting layers such as conformal layers. Luminescent ceramic layers may be more robust than thin film or conformal phosphor layers. In some embodiments, materials other than luminescent ceramics may be used as the wavelength converting element 110, such as phosphors in a binder material.

Examples of phosphors that may be formed into luminescent ceramic layers include aluminum garnet phosphors with the general formula $(Lu_{1-x-y-a-b}Y_xGd_y)_3(Al_{1-z}Ga_z)_5O_{12}$: $Ce_aPr_b$ wherein $0<x<1$, $0<y<1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$ which emit light in the yellow-green range; and $(Sr_{1-x-y}Ba_x Ca_y)_{2-z}Si_{5-a}Al_aN_{8-a}O_a:Eu_z^{2+}$ wherein $0\leq a<5$, $0<x\leq1$, $0\leq y\leq1$, and $0<z\leq1$ such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red emitting phosphors may also be suitable, including $(Sr_{1-a-b}Ca_bBa_c)Si_x N_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yIn_z S_4)$: $Eu^{2+}$ including, for example, $SrGa_2S_4:Eu^{2+}$; $Sr_{1-x}Ba_xSiO_4$: $Eu^{2+}$; and $(Ca_{1-x}Sr_x)S:Eu^{2+}$ wherein $0<x\leq1$ including, for example, $CaS:Eu^{2+}$ and $SrS:Eu^{2+}$.

A luminescent ceramic may be formed by heating a powder phosphor at high pressure until the surface of the phosphor particles begin to sinter together to form a rigid agglomerate of particles. Unlike a thin film, which optically behaves as a single, large phosphor particle with no optical discontinuities, a luminescent ceramic behaves as tightly packed individual phosphor particles, such that there are small optical discontinuities at the interface between different phosphor particles. Thus, luminescent ceramics are optically almost homogenous and have the same refractive index as the phosphor material forming the luminescent ceramic. Unlike a conformal phosphor layer or a phosphor layer disposed in a transparent material such as a resin, a luminescent ceramic generally requires no binder material (such as an organic resin or epoxy) other than the phosphor itself, such that there is very little space or material of a different refractive index between the individual phosphor particles. As a result, a luminescent ceramic is transparent or translucent, unlike a conformal phosphor layer. For more information related to a luminescent ceramic that may be used with the present invention, see U.S. Pub. No. 2005/0269582, which is incorporated herein by reference.

In one embodiment, the luminescent ceramic is eCAS, which is $Ca_{0.99}AlSiN_3:Eu_{0.01}$ synthesized from 5.436 g $Ca_3N_2$ (>98% purity), 4.099 g AlN (99%), 4.732 g $Si_3N_4$ (>98% purity) and 0.176 g $Eu_2O_3$ (99.99% purity). The powders are mixed by planetary ball milling, and fired for 4 hours at 1500° C. in $H_2/N_2$ (5/95%) atmosphere. The granulated powder is uniaxially pressed into pellets at 5 kN and cold isostatically pressed (CIP) at 3200 bar. The pellets are sintered at 1600° C. in $H_2/N_2$ (5/95%) atmosphere for 4 hours. The resulting pellets display a closed porosity and are subsequently hot isostatically pressed at 2000 bar and 1700° C. to obtain dense ceramics with >98% of the theoretical density.

Figure 2:
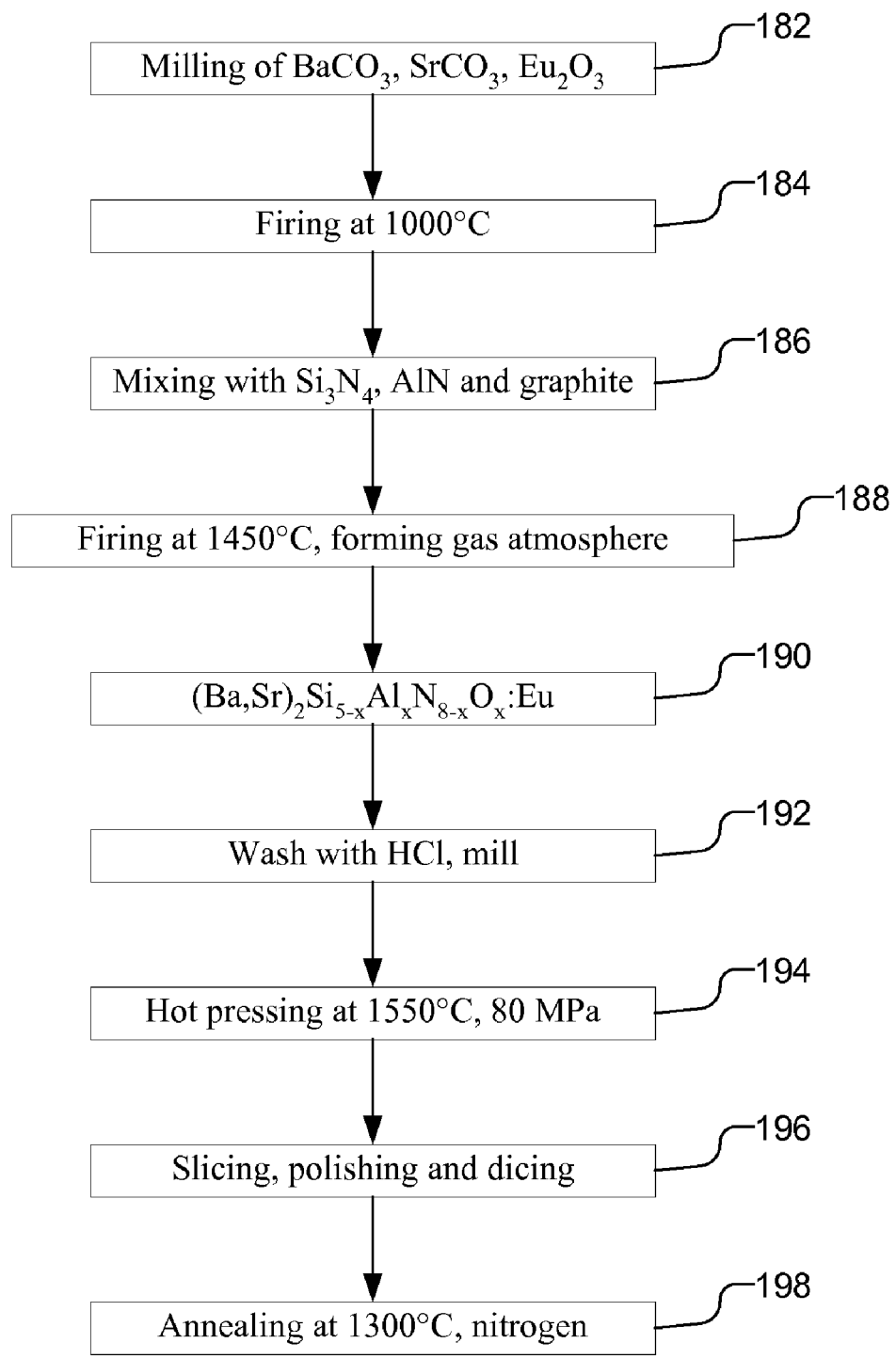
FIG. 2 is a flow diagram schematically showing the preparation of a luminescent ceramic.

In one embodiment, the luminescent ceramic is BSSNE, which is $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$). The flow diagram depicted in FIG. 2 shows schematically how $Ba_{2-x-z}M_xSi_{5-y}Al_yN_{8-y}O_y$: $Eu_z$ (M=Sr, Ca; $0\leq x\leq1$, $0\leq y\leq4$, $0.0005\leq z\leq0.05$) ceramics are prepared. Firstly $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$) is prepared in powder form. Several methods can be applied for this purpose. FIG. 2 illustrates an example of the preparation by carbothermal reduction, which includes mixing 60 g $BaCO_3$, 11.221 g $SrCO_3$ and 1.672 g $Eu_2O_3$ (all 99.99% purity) by planetary ball milling using 2-propanol as dispersing agent (block 182). After drying the mixture is fired in forming gas atmosphere at 1000° C. for 4 hours (block 184) and 10 g of the thus obtained $Ba_{0.8}Sr_{0.2}O:Eu$ (2%) are mixed with 5.846 g $Si_3N_4$ (>98% purity), 0.056 g AlN (99% purity) and 1.060 g graphite (microcrystal grade) (block 186). The powders are thoroughly mixed by 20 min. planetary ball milling and fired for 4 hours at 1450° C. in forming gas atmosphere (block 188) to obtain a precursor powder of $Ba_{2-x-z}M_xSi_{5-y}Al_yN_{8-y}O_y:Eu_z$ (M=Sr, Ca; $0\leq x\leq1$, $0\leq y\leq4$, $0.0005\leq z\leq0.05$) (block 190). The powder is washed with HCl and milled again (block 192). The obtained precursor powder is then hot pressed at 1550° C. and 80 MPa yielding dense ceramic bodies (block 194). These are sliced, polished and diced to obtain the desired shape and optical surface properties (block 196). If necessary annealing at 1300° C. in nitrogen can be applied to remove defects (block 198).

In one embodiment, the luminescent ceramic is SSONE, which is manufactured by mixing 80.36 g $SrCO_3$ (99.99% purity), 20.0 g $SiN_{4/3}$ (>98% purity) and 2.28 g $Eu_2O_3$ (99.99% purity) and firing at 1200° C. for 4 hour in a $N_2/H_2$ (93/7) atmosphere. After washing, the precursor powder is uniaxially pressed at 10 kN and subsequently cold isostatic pressed at 3200 bar. Sintering is typically done at temperatures between 1550° C. and 1580° C. under $H_2/N_2$ (5/95) or pure nitrogen atmosphere.

Referring back to FIG. 1, in one embodiment, the input side 111 of the wavelength converting element 110 is directly covered with a color separation element 116. The color separation element 116 transmits the blue pump light and reflects the wavelengths in the range of the light converted by the wavelength converting element 110. The color separation element 116 may be a high angular acceptance coating that is directly applied to the input side 111 of the wavelength converting element 110, which is facing the light source 102. In other words, the color separation element 116 is between the light source 102 and the wavelength converting element 110. As illustrated in FIG. 1, neither the color separation element 116 is not in direct contact with the light source 102, i.e., both the color separation element 116 and the wavelength converting element 110 are physically separated from the light source 102.

Figure 3:
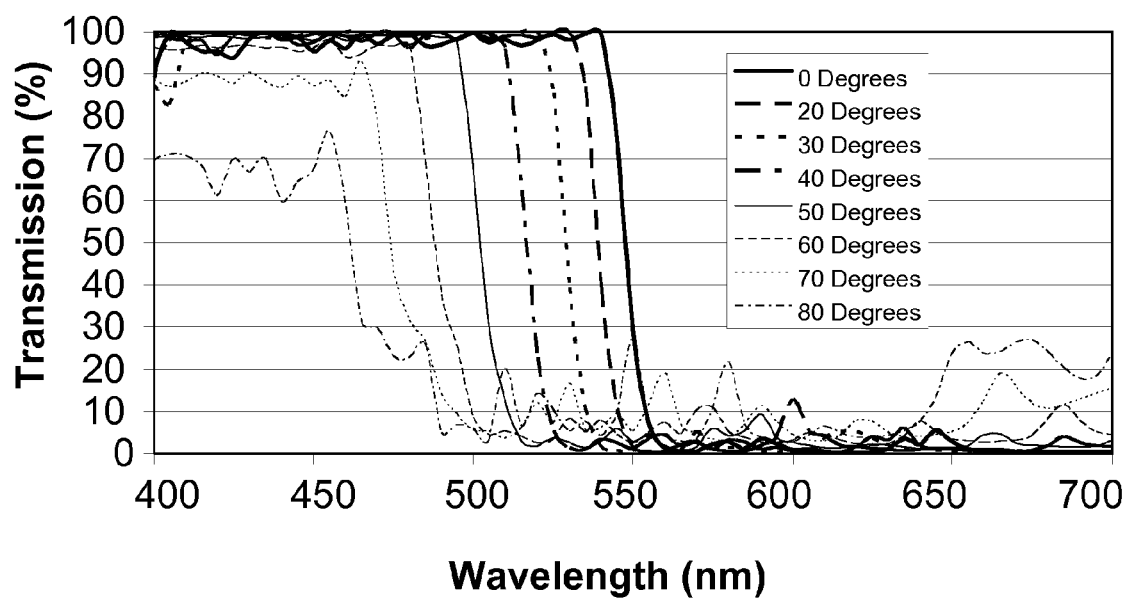
FIG. 3 illustrates the transmission characteristics of one suitable embodiment of a dichroic filter coating as a function of wavelength for different angles of incidence.

The color separation element 116 may be, e.g., a directly applied dichroic coating with the high angular acceptance. If desired, other color separation material may be used, such as a cholesteric film, a diffractive or holographic filter, particularly where the angular emission of the light source 102 is reduced such as from an LED with photonic crystals. FIG. 3 illustrates the transmission characteristics as a function of wavelength for different angles of incidence for one suitable embodiment of a directly applied dichroic coating that may be used as the color separation element 116. Filters with a high angular acceptance can be designed specifically for this purpose. For example, a dichroic coating may be formed on the wavelength converting element 110 using a stack of multiple layers of higher and lower refractive materials. Typically, a filter is desired with a high angular acceptance by appropriately choosing different coating materials with higher refractive indices and optimized thicknesses. The design and manufacture of such a filter is well within the abilities of those with ordinary skill in the art. The use of a high angular acceptance dichroic coating for the color separation element 116 is advantageous because it eliminates the need for an extra optical element to collimate the light prior to the color separation element 116, thereby reducing the cost and dimensions of the device.

As can be seen in FIG. 3, the color separation element 116 has a high transmission of blue pump wavelengths, e.g., from 415 nm to 465 nm. Thus, the light emitted by light source 102 will be transmitted through the color separation element 116 into the wavelength converting element 110. The wavelength converting element 110 internally emits light isotropically. The forward emitted light, i.e., the light emitted towards the output side 112 of the wavelength converting element 110, has a chance to escape directly. However, a large portion of the light emitted by the wavelength converting element 110 will be either back emitted, i.e., emitted in the direction of the input side 111, or will be forward emitted but will be reflected backwards at the output side 112 of the wavelength converting element 110 due to the large difference in the index of refraction between the wavelength converting element 110, e.g., n=1.7-2.6, and the medium into which the light is emitted, e.g., n=1.0. As can be seen in FIG. 3, the color separation element 116 has a low transmission, i.e., high reflectance, in the wavelengths of the converted light, e.g., wavelengths greater than 500 nm. Thus, the color separation element 116 prevents the back emitted or back reflected light from escaping from the wavelength converting element 110 towards the light source 102.

Figure 4:
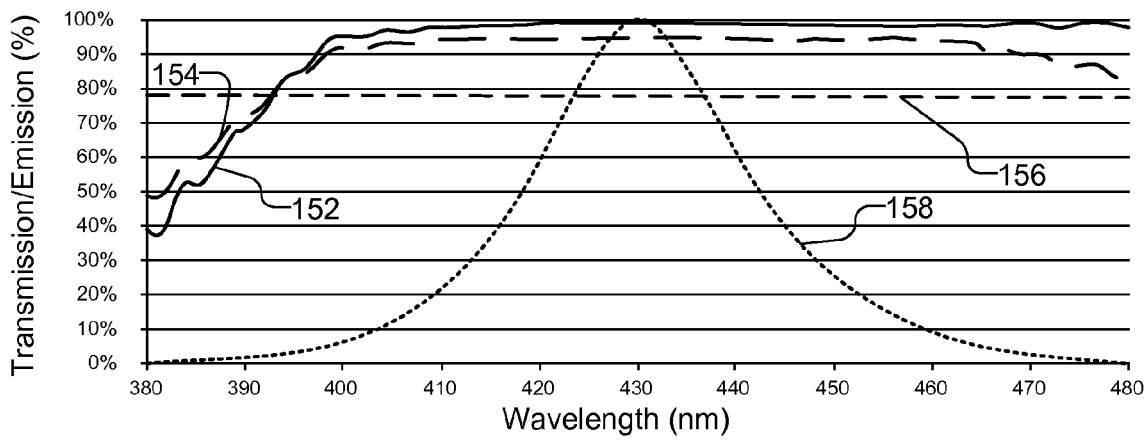
FIG. 4 illustrates the performance of one suitable embodiment of the dichroic filter coating with regard to the transmission of the Blue pump light as a function of wavelength for a lambertian source.

As discussed above, two important criteria for the performance of the illumination device 100 includes the transmission of the blue pump wavelengths, e.g., anywhere from 415 nm to 465 nm, and the reflection of the wavelength converted light, e.g., Orange, Green, or Red converted light. FIG. 4 illustrates the performance of one suitable embodiment of the color separation element 116 with regard to the transmission of the Blue pump light as a function of wavelength for a lambertian source. For reference purposes, FIG. 4 shows transmission curves 152 and 154 for both a 60° lambertian and a full hemisphere (±90°) lambertian, respectively. For sake of comparison, the transmission of a bare luminescent ceramic is shown as curve 156, while the spectra of the Blue pump light is illustrated as curve 158. While a cone smaller than 60° may be interesting, e.g., where a photonic lattice structure emits more light in a smaller cone angle, FIG. 4 shows that even at ±90°, the transmission performance can still be significantly better than an uncoated luminescent ceramic. As can be seen in FIG. 4, the wavelengths that are efficiently transmitted by the color separation element 116 should cover a large range so that a range of Blue pump wavelengths can be accommodated, which reduces the need to sort or bin the light emitting diodes 104 by wavelength, particularly when the absorption spectra of the wavelength converting element 110 is similarly broad.

Figure 5:
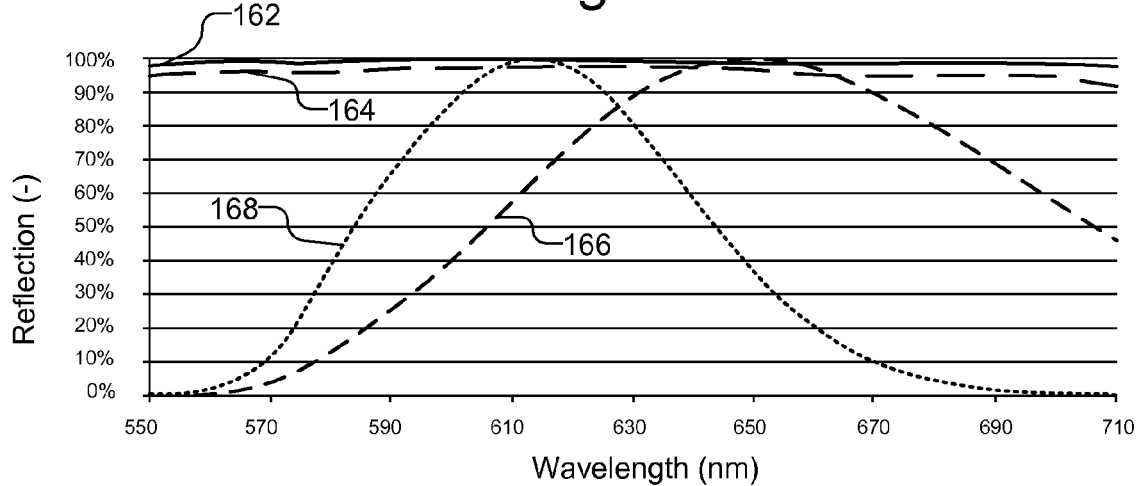
FIG. 5 illustrates the performance of one suitable embodiment of the dichroic filter coating with regard to the reflection of the wavelength converted light.

FIG. 5 illustrates the performance of one suitable embodiment of the color separation element 116 with regard to the reflection of the wavelength converted light. FIG. 5 shows the isotropic reflection inside the medium that is coated with color separation element 116 as curve 162 and the external air-medium curve with a lambertian as curve 164, i.e., cure 164 shows the averaged external lambertian reflection for a ±90° cone averaged over 550-660 nm. FIG. 5 also shows the saturated Red emission from a CaAlSiN phosphor as curve 166 and the Red spectral emission weighted with the CIE_Y eye photopic sensitivity curve as curve 168. Curves 166 and 168 are provided to show which wavelength band is most important for most applications. The main design intent is to reflect inside the wavelength converting element 110 the colored light that provides the correct color point and the most lumens.

Figure 6:
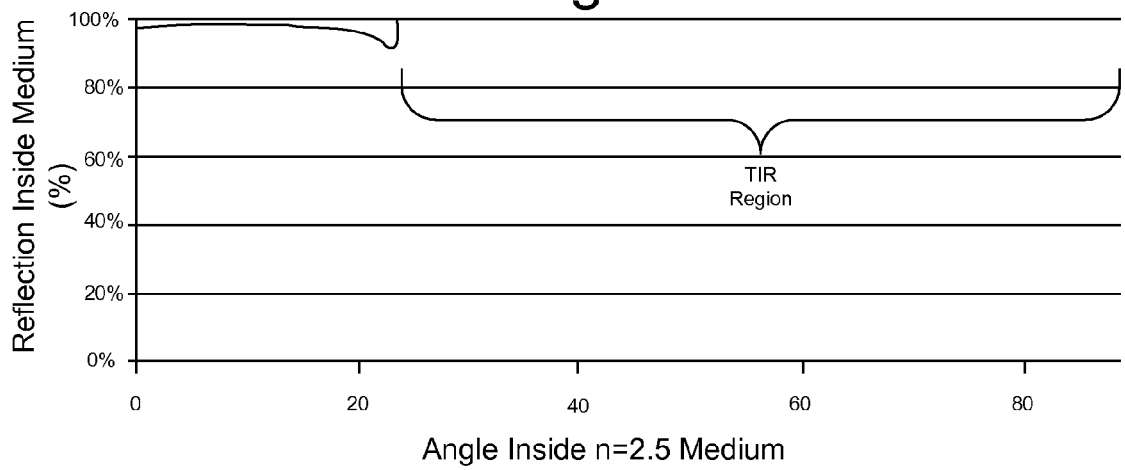
FIG. 6 illustrates the average reflection versus angle for wavelengths between 550 nm to 660 nm in an n=2.5 medium, such as the wavelength converting element.

FIG. 6 illustrates the average reflection versus angle for wavelengths between 550 nm to 660 nm in an n=2.5 medium, such as the wavelength converting element 110. The light emitted inside the wavelength converting element 110 has an isotropic angular distribution. As illustrated in FIG. 6, the higher angle light will be totally internally reflected (TIR) and within the regular escape cone, the reflected light will be controlled by the high angular acceptance color separation element 116. An illumination device 100 with such properties will reflect more than 98% of the back emitted light from the wavelength converting element 110 at each bottom reflection at the input side of the wavelength converting element 110, thereby providing another chance that the light will be emitted from the output side of the wavelength converting element 110.

Figure 7:
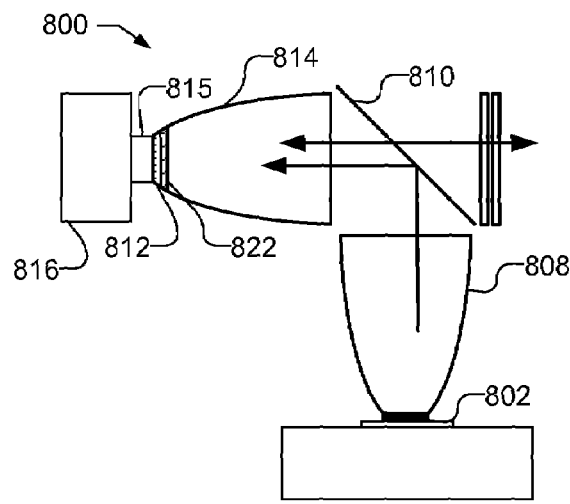
FIG. 7 illustrates an illumination device that uses a remote wavelength converting element.
Figure 17:
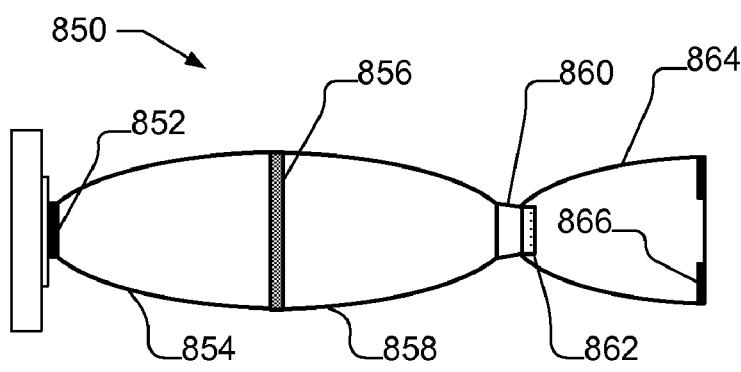
FIG. 17 illustrates an illumination device that uses a remote wavelength converting element and an aperture (étendue) recycled light.

For the sake of comparison, FIG. 7 illustrates an illumination device 800 that is described in more detail in U.S. Pub. 2005/0270775, entitled "Remote Wavelength Conversion in an Illumination Device", by Gerard Harbers et al., which has the same assignee as the present application and the entirety of which is incorporated herein by reference. Illumination device includes a blue/UV LED light source 802 that produces light that is collimated by a collimator 808 and reflected by a dichroic mirror 810 and concentrated by another collimator 814 towards a phosphor element 812. Phosphor element 812 is mounted on a reflective substrate 815 and a heat sink 816. A radiance enhancement structure 822 (and/or polarization recovery component) is illustrated as mounted over the phosphor element 812. The phosphor converted light is collimated by collimator 814 and transmitted through dichroic mirror 810. Unconverted light is reflected off reflective substrate 815 and dichroic mirror 810 to be recycled by LED 802. In another embodiment, the dichroic mirror 810 may be replaced by a dichroic filter that transmits the blue/UV pump light and reflects the phosphor converted light, as illustrated in FIG. 17. The phosphor element emits forward emitted light out of the system and back emitted light is collimated again and reflected by the dichroic filter. Such an embodiment is described in more detail in U.S. Ser. No. 11/248,945, entitled "Illumination System With Optical Concentrator And Wavelength Converting Element", by Serge J. Bierhuizen et al., filed Oct. 11, 2005, which has the same assignee as the present application and the entirety of which is incorporated herein by reference. In both embodiments, collimation/concentrating optics are used before and after the wavelength filtering by the dichroic mirror/filter. Consequently, the efficiency of such an illumination device depends greatly on the efficiency of the optical collimating and concentrating components.

In comparison to the illumination device 800, an illumination device 100 in accordance with an embodiment of the present invention reduces cost and dimensions, while improving recycling of backward emitted light or forward emitted light that is recycled. Moreover, the light need not be collimated prior to the color filter element in illumination device 100. Further, the illumination device 100 avoids bonding the phosphor to the light source, which reduces negative effects such as thermally induced stress caused by CTE mismatch in comparison to the device shown in FIG. 7.

Figure 8:
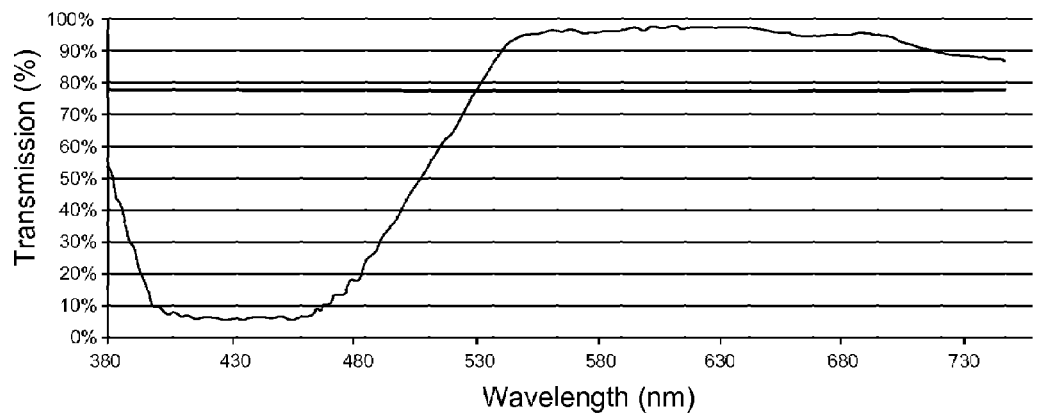
FIG. 8 illustrates the transmission characteristics of one suitable embodiment of one suitable embodiment of a second dichroic filter coating as a function of wavelength as an average of the different angles of incidence.

Referring back to FIG. 1, it should be understood that depending on the thickness and concentration of wavelength converting material in the wavelength converting element 110, not all blue pump light may be converted. The unconverted blue pump light may be permitted to escape through the output side 112 of the wavelength converting element 110. In one embodiment, however, a second color separation element 118 is used to reflect the unconverted blue pump light back into the wavelength converting element. As shown in FIG. 1, the output side 112 of the wavelength converting element 110 may be directly coated with a dichroic filter to serve as the second color separation element 118. FIG. 8 illustrates the transmission characteristics as a function of wavelength as an average of the different angles of incidence for one suitable embodiment of the dichroic coating that serves as the second color separation element 118. As illustrated in FIG. 8, the second color separation element 118 is configured to reflect most of the blue light and transmit the orange/red converted light in this example. As discussed above, the production of an adequate color separation element 118 that produces the desired transmission characteristics is well within the knowledge of those skilled in the art. It should be understood, however, that the second color separation element 118 need not be used if desired.

Figures 9A, 9B:
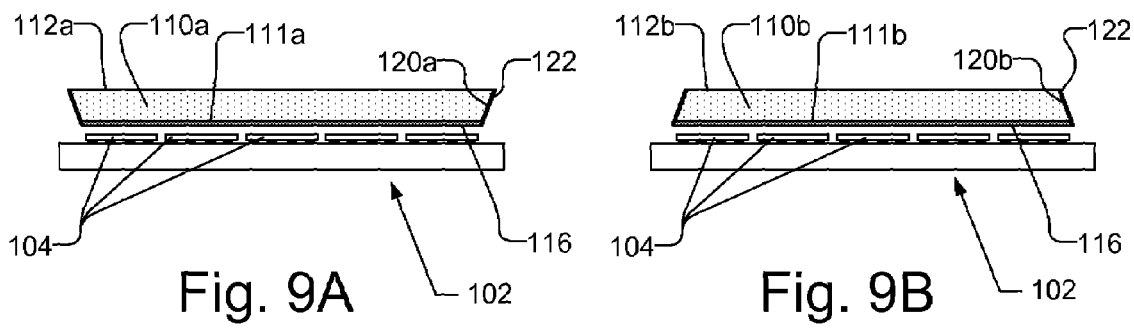
FIGS. 9A and 9B illustrate embodiments of the wavelength converting elements with angled sides.

In addition, if desired, the sides 120 of the wavelength converting element 110 may be coated with a protected reflecting coating 122, such as silver or aluminum, to reflect any light that hits the sides 120 back into the wavelength converting element 110 for improved extraction efficiency. The sides 120 may also be roughened to scatter the reflected light. In another embodiment, the light within the wavelength converting element 110 can be scattered by internal scattering regions, such as intentional holes or micro-cavities in the wavelength converting element 110 causing MIE scattering within the wavelength converting element 110. In some embodiments, the sides 120 of the wavelength converting element 110 may be angled such that the input side 111 and the output side 112 of the wavelength converting element have different areas. FIGS. 9A and 9B illustrate embodiments of the wavelength converting elements 110a and 110b, respectively, with angled sides. As illustrated in FIG. 9A, the sides 120a are angled outwards so that the input side 111a has a smaller area than the output side 112a of the wavelength converting element 110a. Conversely, as illustrated in FIG. 9B, the sides 120b are angled inwards so that the input side 111b has a larger area than the output side 112b of the wavelength converting element 110b. The optimum angle of the sides (either inwards or outwards) depends on the application as it can increase or decrease the emitting surface area and thereby increase or decrease the brightness of the source.

Figure 10:
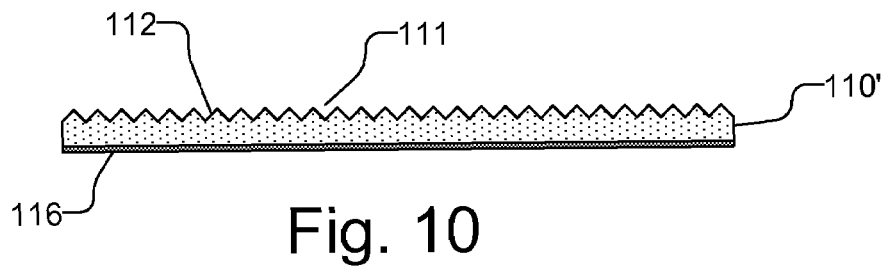
FIG. 10 illustrates an embodiment of a wavelength converting element with a roughened surface.

In another embodiment, the output side 112 of the wavelength converting element 110 may have a roughened surface to enhance the light extraction at the output side of the wavelength converting element. FIG. 10, by way of example, illustrates an embodiment of a wavelength converting element 110' with a color separation element 116 on the input side 111 of the wavelength converting element 110' and the output side 112' is a roughened surface. Roughening the surface of the output side 112 of the wavelength converting element 110' may be performed using well-known processing methods, such as wet chemical etching, dry chemical and related techniques.

As illustrated in FIG. 1, the wavelength converting element 110 may be thermally coupled to and held by one or more sides 120 by a heat sink 130 to provide compact, low cost cooling. A portion, i.e., less than approximately 30%, of either the output side 112 or the input side 111 (or both) of the wavelength converting element 110 may also be in contact with the heat sink 130, e.g., for stability. Thus, the input area of the wavelength converting element 110, i.e., the area of the input side 111 that receives light from the light source 102, and the output area of the wavelength converting element 110, i.e., the area of the output side 112 from which light is externally emitted from the wavelength converting element 110, are unsupported by the heat sink 130. In some embodiments, the reflecting coating 122 may also be deposited on the portion of the output side 112 (or the input side 111) that is covered with the heat sink 130 to assist in recycling. Alternatively, the reflecting coating 122 may be deposited on the heat sink 130 or may be part of the heat sink 130 itself, e.g., where the heat sink 130 is manufactured from a reflective material. The heat sink 130 and/or the reflecting coating 122 on the output side 112 of the wavelength converting element 110 may be used to control the output area and thereby the system etendue. The luminescent ceramic slab that may serve as the wavelength converting element 110 can be easily supported by the sides 120. Moreover, a luminescent ceramic has good thermal conductivity, approximately greater than 10 W/(mK). The use of a heat sink 130 that holds the wavelength converting element 110 only by the at least one side 120 (and possible a small portion of the output side 112 and/or input side 111) is advantageous as it reduces optical losses caused by conventional heat sinks that support wavelength converting elements over the entire output or input side. Moreover, because conventional heat sinks used with wavelength converting elements are produced with sapphire or other similar material, the cost is reduced with heat sink 130.

Further, the heat sink 130 provides the ability to mechanically position the wavelength converting element 110 close to the light source 102 while controlling the temperature of the wavelength converting element 110 to improve efficiency of the wavelength converting element 110. As illustrated in FIG. 1, the heat sink 130 may be coupled to the light source 102 heat sink 106. Alternatively, the heat sink 130 and heat sink 106 may be a single heat sink. Alternatively, the heat sink 130 may be separated from the heat sink 106. Additionally, the heat sink 130 may include cooling elements such as fins 131. Other cooling or heat transfer elements may be used if desired, such as heat pipes.

Figure 11A:
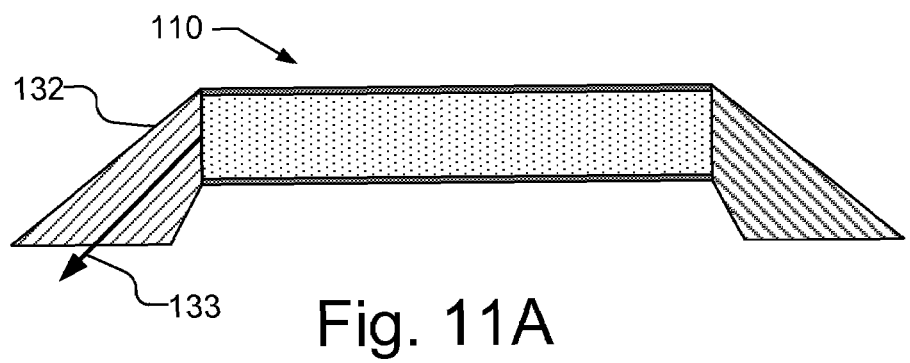
FIGS. 11A and 11B illustrate different possible embodiments of heat sinks, which hold the wavelength converting element by the side.
Figure 11B:
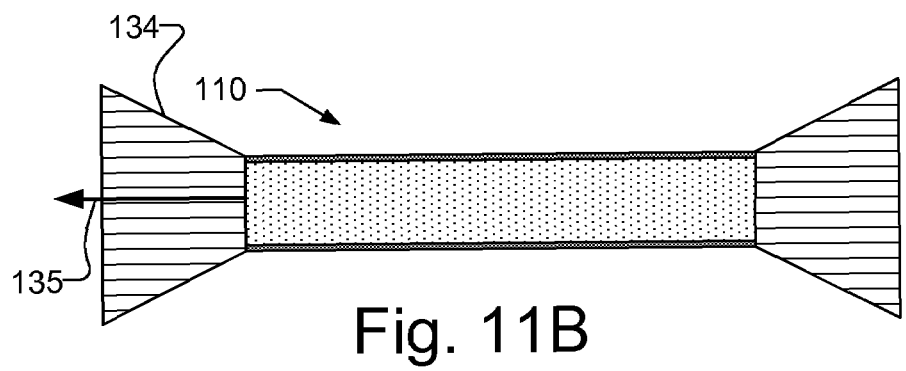
Figure 12:
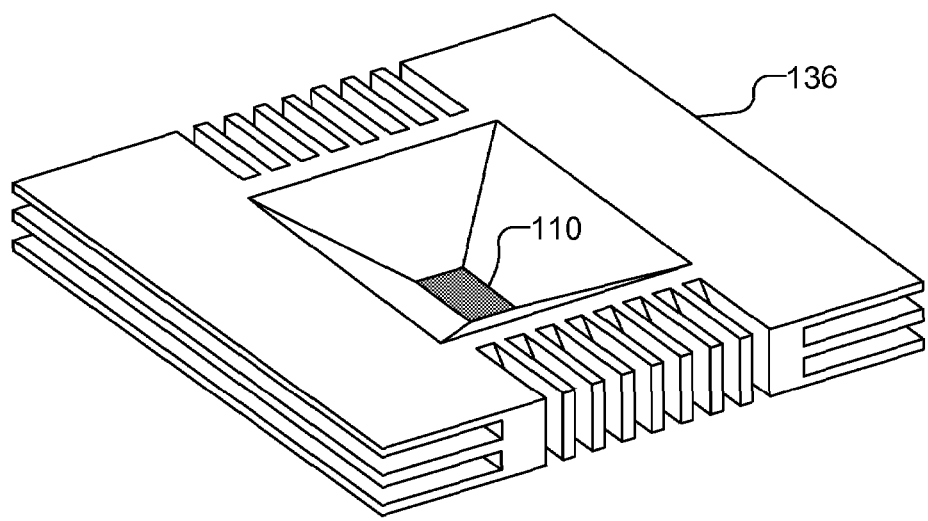
FIG. 12 illustrates a perspective view of another possible embodiment of a heat sink that holds the wavelength converting element.

The heat sink 130 may be produced, e.g., using copper or other conductive material, such as aluminum or graphite. Copper, by way of example, has a high thermal conductivity of approximately 390 W/(mK). The thermal conductivity of graphite in the basal plane (>1000 W/(mK)) is much higher than the thermal conductivity of graphite across the basal plane (<100 W/(mK)). Thus, a heat sink 130 manufactured with graphite should be oriented with the basal plane directed away from the wavelength converting element 110. FIGS. 11A and 11B illustrate side views of different possible embodiments of a heat sink 132 and 134, respectively, which hold the wavelength converting element 110 by the side. Where the heat sinks 132 and 134 are manufactured from graphite, the basal plane is illustrated by arrows 133 and 135. FIG. 12 illustrates a perspective view of another possible embodiment of a heat sink 136, which holds the wavelength converting element 110 by the side.

Figure 13:
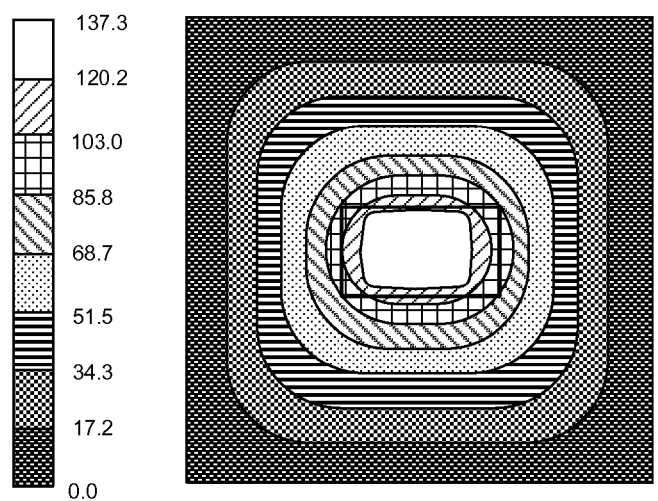
FIG. 13 illustrates a graph of the heat transfer of a wavelength converting element.

FIG. 13 illustrates a graph illustrating the heat transfer of a wavelength converting element 110 that is a 1 mm thick luminescent ceramic that is 20 mm×20 mm and has a thermal conductivity of 14 W/(mK) and is surrounded by a heat sink manufactured from copper that is similar to that shown in FIG. 12. The center rectangle in the graph illustrates the position of the heat source, i.e., the area of the wavelength converting element 110 that is heated by the light source 102, which is centered relative to the wavelength converting element and having dimensions of 7 mm×4 mm and produces 7 W of heat. As can be seen in FIG. 13, a luminescent ceramic wavelength converting element 110 efficiently transfers absorbed energy to the sides where the heat can be drawn off by the heat sink 130.

As illustrated in FIG. 1, the illumination device 100 may also include reflecting optics 140 that may be used for collimating and/or recycling the light. Reflecting optics 140 are similar to that described in U.S. Ser. No. 11/104,220, Titled "Illuminators Using Reflective Optics With Recycling and Color Mixing", by Gerard Harbers et al., filed Apr. 11, 2005, which has the same assignee as the present disclosure and the entirety of which is incorporated herein by reference. Reflecting optics 140 includes a side portion 142 that forms, e.g., a parabolic reflector for collimating the light emitted by the light source 102 through the entrance of the reflecting optics 140, which is optically coupled to the output side 112 of the wavelength converting element 110. The side portion 142 may have shapes other than parabolic if desired. The reflector will typically have a circular or rectangular cross-section. The parabolic reflector side portion 142 is made of or coated with a reflective material, such as aluminum, silver, or 3M ESR reflective film or any other appropriate reflective material. Alternatively, the reflecting optics 140 may be a solid transparent material, such as plastic or glass, uses total internal reflection (TIR) caused by the difference between refraction indices of material and air for collimating light to reflect and collimate the light.

The reflecting optics 140 may also include a reflective aperture, which is formed from a reflective disk 144 that defines an exit in the form of opening 146. The reflective disk 144 may be integral to the reflecting optics 140 or may be a separate piece that is coupled to the reflecting optics 140. The opening 146 may be circular, square or any other desired shape. Any light that is not directed through the opening 146 is reflected back into the reflecting optics 140. The reflected light is then eventually re-reflected towards the opening 146 to create a concentrated collimated light beam. The opening 146 may include a polarizing mirror so that light having only a certain polarization state is transmitted while light with other polarization states is reflected back into the reflecting optics 140.

Figure 14:
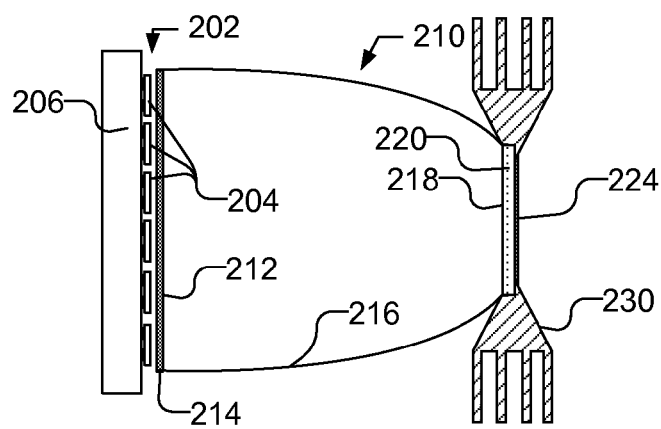
FIG. 14 illustrates another illumination device in accordance with an embodiment of the present invention.

FIG. 14 illustrates another illumination device 200 in accordance with an embodiment of the present invention. The illumination device 200, similar to illumination device 100, includes a light source 202, which may be, e.g., one or more blue or UV LEDs 204 mounted on a heat sink 206. In some embodiments, the light emitting diodes 204 may be mounted on a submount (not shown), which is mounted to the heatsink 206. The angular emission pattern of the LEDs 204 can be lambertian or controlled using, e.g., a photonic lattice structure. A concentrator element 210 is positioned so that the entrance or input side 212 of the concentrator element 210 is held close to the light source 202 to capture a large portion of the entire angular distribution. A high angular acceptance color separation element 214 may be directly or indirectly applied to the input side 212 of the concentrator element 210. The color separation element 214 may be similar to the color separation element 116 described above.

The concentrator element 210 may be formed with the sides 216 made of or coated with a reflective material, such as aluminum, silver, or 3M ESR reflective film or any other appropriate reflective material. Alternatively, the concentrator element 210 may be a solid transparent material, such as plastic or glass, uses total internal reflection (TIR) caused by the difference between refraction indices of material and air for collimating light to reflect and collimate the light. The concentrator element 210 reflects and concentrates the light on a wavelength converting element 220 positioned at the exit or output side 218 of the concentrator element 210, thereby increasing the irradiance (W/mm$^2$) level of the light entering the wavelength converting element 220. The wavelength converting element 220 may be similar to the wavelength converting element 110 discussed in reference to FIG. 1.

Figures 15, 16:
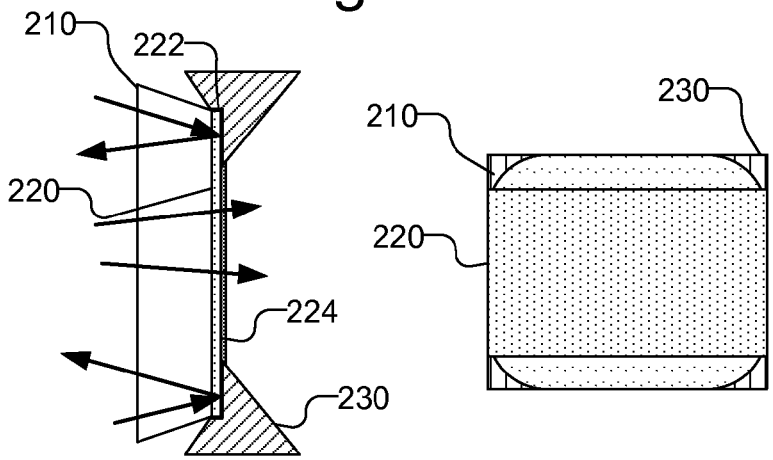
FIG. 15 shows a close up view of the wavelength converting element.
FIG. 16 illustrates a top view of an étendue limited exit aperture.

FIG. 15 shows a close up view of the wavelength converting element 220. As can be seen in FIG. 15, the sides of the wavelength converting element 220 are coated with a reflective coating 222, such as silver or aluminum, which provides aperture (étendue) recycling. The reflective coating 222 reflects the light back into the wavelength converting element 220 and the concentrator element 210 for recycling, as illustrated by the arrows in FIG. 15. A heat sink 230 holds the wavelength converting element 220 by the sides. Additionally, the heat sink 230 and the reflective coating 222 extends over the output side of the wavelength converting element 220 to serve as a reflective aperture. Moreover, the extension of the heat sink 230 over the output side of the wavelength converting element increases the active cooling area which is beneficial due to the increased energy density at the wavelength converting element 220. FIG. 16 illustrates a top view of a rectangular exit aperture formed by the concentrator element 210, the wavelength converting element 220 and the heat sink 230, which limits the emitting area and the étendue of the system to closely match the system acceptance and design of the subsequent optics.

Depending on the thickness and concentration of wavelength converting material in the wavelength converting element 220, not all light may be converted. A second color separation element 224 may be directly coated on the output side of the wavelength converting element 220 or, alternatively, the surface of the output side of the wavelength converting element 220 may be roughened. In another embodiment, the second color separation element 224 may be positioned near but not directly coated on the wavelength converting element 220. The transmission characteristics as a function of wavelength as an average of the different angles of incidence for one suitable embodiment of the dichroic coating that serves as the second color separation element 224 are illustrated in FIG. 8.

Figure 18:
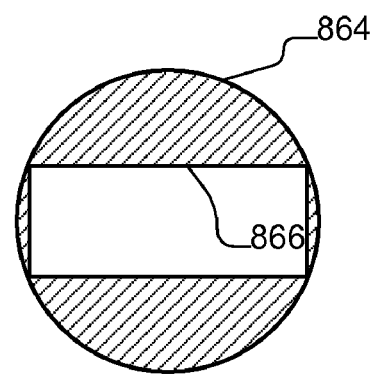
FIG. 18 illustrates the top view of the rectangular exit aperture of the illumination device of FIG. 17.

For the sake of comparison, FIG. 17 illustrates an illumination device 850 that is described in more detail in U.S. Ser. No. 11/248,945, entitled "Illumination System With Optical Concentrator And Wavelength Converting Element", by Serge J. Bierhuizen et al., filed Oct. 11, 2005, and in U.S. Ser. No. 11/104,220, Titled "Illuminators Using Reflective Optics With Recycling and Color Mixing", by Gerard Harbers et al., filed Apr. 11, 2005, both of which have the same assignee as the present disclosure and the entirety of each is incorporated herein by reference. Illumination device 850 includes a blue/UV LED light source 852 that produces light that is collimated by a collimator 854 and transmitted by a dichroic filter 856 and concentrated by a solid concentrator 858 towards a phosphor element 862 that is mounted on a tapered silver/aluminum coated sapphire disk 860, which is used to cool the phosphor element 862. The phosphor converted light is transmitted out of the system or recycled via the dichroic filter 856. The converted light that is transmitted out of the system is partly recycled by a collimator 864 with a reflective aperture 866 that forms a rectangular aperture to limit the étendue to the system acceptance. FIG. 18 illustrates the top view of the rectangular aperture formed by the reflective aperture 866 and the recycling collimator 864.

In comparison to the illumination device 850, an illumination device 200 of FIG. 14, in accordance with an embodiment of the present invention, reduces cost and dimensions, while improving recycling of backward emitted light or secondary recycled light. Further, the efficiency of the illumination device 200 is increased as the aperture (étendue) recycled light is not first collimated, then reflected by an external aperture as in the illumination device 850, but is directly recycled at the wavelength converting element 220 interface. Further, with the heat sink 230 that holds the wavelength converting element 220 primarily by the sides, the sapphire disk 860 that supports the phosphor element 862 over the input surface is eliminated, thereby improving cost and efficiency.

Consequently, the illumination device 200 increases brightness and reduces size and cost by aperture (étendue) recycling directly on the wavelength converting element 220 instead of using secondary recycling using a collimator 864, which results in unwanted losses. Direct aperture recycling on the wavelength converting element 220 also enables an improved and lower cost thermal design that does not require a silver coated sapphire disk 860 by an effective increase of cooling surface area.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An illumination device comprising:
   a light source emitting light having a first wavelength range;
   a wavelength converting element that receives the emitted light from the light source, the wavelength converting element at least partially converting the emitted light having a first wavelength range into light having a second wavelength range, the wavelength converting element being planar and having a bottom surface, a top surface, and at least one side between the bottom surface and top surface; and
   a heat sink thermally holding the wavelength converting element so that the wavelength converting element is not in direct contact with the light source, the heat sink holding the wavelength converting element by the at least one side of the wavelength converting element so that neither the bottom surface of the wavelength converting element that receives the emitted light from the light source nor the top surface of the wavelength converting element from which the light having a second wavelength range is emitted by the wavelength converting element are supported by the heat sink;
   wherein the heat sink covers a portion of the top surface of the wavelength converting element to define an output area of the wavelength converting element.

2. The illumination device of claim 1, wherein the portion of the top surface covered by the heat sink is approximately 30% or less.

3. The illumination device of claim 1, wherein the light source includes at least one light emitting diode.

4. The illumination device of claim 1, further comprising a color separation element directly coupled to the wavelength converting element, wherein the heat sink holds the wavelength converting element and the color separation element so that neither the wavelength converting element nor the color separation element are in direct contact with the light source.

5. The illumination device of claim 4, wherein the color separation element is a coating applied to the wavelength converting element.

6. The illumination device of claim 4, wherein the color separation element is positioned between the light source and the wavelength converting element.

7. The illumination device of claim 4, further comprising a second color separation element, the color separation element and the second color separation element being on opposite surfaces of the wavelength converting element.

8. The illumination device of claim 1, further comprising an optical element having an entrance and an exit, the entrance is optically coupled to the wavelength converting element to receive the light having a second range of wavelengths from the wavelength converting element.

9. An illumination device comprising:
   a light source emitting light having a first wavelength range;
   a wavelength converting element that receives the emitted light from the light source, the wavelength converting element at least partially converting the emitted light having a first wavelength range into light having a second wavelength range, the wavelength converting element being planar and having a bottom surface, a top surface, and at least one side between the bottom surface and top surface;
   a heat sink thermally holding the wavelength converting element so that the wavelength converting element is not in direct contact with the light source, the heat sink holding the wavelength converting element by the at least one side of the wavelength converting element so that neither the bottom surface of the wavelength converting element that receives the emitted light from the light source nor the top surface of the wavelength converting element from which the light having a second wavelength range is emitted by the wavelength converting element are supported by the heat sink; and
   an optical element having an entrance surface and an exit surface, the entrance surface optically coupled to the light source to receive the light having a first range of wavelengths from the light source, the heat sink positioning the wavelength converting element at the exit surface.

10. The illumination device of claim 9, further comprising a color separation element coupled to the entrance surface of the optical element.

11. The illumination device of claim 1, wherein the light source is thermally coupled to the heat sink.

12. The illumination device of claim 1, further comprising a reflective coating between the heat sink and the wavelength converting element.

13. The illumination device of claim 12, wherein the reflective coating is one of silver and aluminum.

14. The illumination device of claim 12, wherein the surface of the wavelength converting element covered by the reflective coating is roughened.

15. The illumination device of claim 1, wherein the at least one side is angled so that the bottom surface and top surface have different areas.

16. An illumination device comprising:
a light source emitting light along an optical path, the light having a first wavelength range;
a wavelength converting element mounted in the optical path to receive the emitted light having a first wavelength range, the wavelength converting element converting the light having a first wavelength range into light having a second wavelength range, the wavelength converting element being planar and having a bottom surface, a top surface, and at least one side between the bottom surface and the top surface;
a color separation element directly coupled to the wavelength converting element, wherein the wavelength converting element and the color separation element are not in direct contact with the light source along the optical path; and
a heat sink thermally coupled to and holding the wavelength converting element by the at least one side, the heat sink being configured to hold the wavelength converting element so that the bottom surface of the wavelength converting element that receives the light having a first wavelength range from the light source and the top surface of the wavelength converting element from which the light having a second wavelength range is emitted are unsupported by the heat sink;
wherein the heat sink is coupled to the top surface of the wavelength converting element, the heat sink defining an output area of the wavelength converting element.

17. The illumination device of claim 16, wherein the color separation element is a coating applied to the wavelength converting element.

18. The illumination device of claim 16, wherein the color separation element is positioned between the wavelength converting element and the light source.

19. The illumination device of claim 16, wherein the wavelength converting element has an input side that receives the light having a first wavelength range from the light source and an output side from which the light having a second wavelength range is emitted, the illumination device further comprising a second color separation element, the color separation element being directly coupled to the input side and the second color separation element being coupled to the output side.

20. The illumination device of claim 16, wherein the light source is thermally coupled to the heat sink.

21. The illumination device of claim 16, wherein the light source includes at least one light emitting diode.

22. The illumination device of claim 16, wherein the illumination device further comprises a reflective coating on at least one surface of the wavelength converting element.

23. The illumination device of claim 22, wherein the reflective coating is one of silver and aluminum.

24. The illumination device of claim 16, wherein the at least one side of the wavelength converting element is roughened.

25. The illumination device of claim 16, wherein the at least one side is angled so that the bottom surface and top surface have different areas.

26. The illumination device of claim 16, wherein the top surface of the wavelength converting element is roughened.

27. The illumination device of claim 16, further comprising an optical collimator having an entrance and an exit, the entrance is optically coupled to the wavelength converting element to receive the light having a second range of wavelengths from the wavelength converting element, the optical collimator approximately collimating the light received at the entrance from the wavelength converting element.

28. The illumination device of claim 16, further comprising:
an optical concentrator having an entrance surface and an exit surface, the entrance surface optically coupled to the light source to receive the light having a first range of wavelengths from the light source, the optical concentrator concentrating the light received at the entrance surface to the exit surface which is smaller than the entrance surface, the wavelength converting element mounted at the exit surface; and
a second color separation element coupled to the entrance surface of the optical concentrator.

29. The illumination device of claim 1 wherein the wavelength converting element is a ceramic phosphor.

* * * * *